United States Patent
Chuang et al.

(10) Patent No.: US 6,563,338 B2
(45) Date of Patent: May 13, 2003

(54) CONTROL CIRCUIT AND CHIPSET ON MOTHERBOARD FOR SAVING TERMINAL RESISTORS AND METHOD FOR REALIZING THE SAME

(75) Inventors: Ching-Fu Chuang, Taipei (TW); Nai-Shung Chang, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/921,950

(22) Filed: Aug. 3, 2001

(65) Prior Publication Data

US 2002/0024361 A1 Feb. 28, 2002

(30) Foreign Application Priority Data

Aug. 24, 2000 (TW) ........................................ 89117012 A

(51) Int. Cl.⁷ .............................................. H03K 17/16
(52) U.S. Cl. .............................. 326/30; 326/86; 326/90; 326/26; 326/27
(58) Field of Search .............................. 326/30, 86, 90, 326/27, 83, 82, 26

(56) References Cited

U.S. PATENT DOCUMENTS

| | | | | |
|---|---|---|---|---|
| 5,952,848 | A | * 9/1999 | Morris | ........................ 326/81 |
| 6,133,755 | A | * 10/2000 | Huang et al. | .................. 326/83 |
| 6,229,335 | B1 | * 5/2001 | Huang et al. | .................. 326/30 |

* cited by examiner

Primary Examiner—Michael Tokar
Assistant Examiner—Vibol Tan
(74) Attorney, Agent, or Firm—J.C. Patents

(57) ABSTRACT

A control circuit, a chipset and a method capable of saving the terminal resistors on a motherboard. Through the determination of connection of a pull-up enable line to a first voltage source $V_{dd}$ via a resistor, an equivalent resistance is set between the source terminal and the drain terminal of a field effect transistor. The equivalent resistance is almost identical to the terminal resistor and hence can replace the resistor on the motherboard. When the pull-up enable line is connected to the first voltage source $V_{dd}$ via a resistor, an equivalent resistance of about 45–60Ω is established between the source and drain terminal of the field effect transistor. The equivalent resistance is connected in parallel with an input/output pad and a second voltage source $V_{tt}$ to replace the original externally connected terminal resistor $r_{t2}$ at the other end of the bus. If the pull-up enable line is not connected to a first voltage source $V_{dd}$ via a resistor, the field effect transistor is cut off and an infinite equivalent resistance is created between the source and the drain terminal. The infinite resistance is connected in parallel between the input/output pad and the second voltage source $V_{tt}$. The infinite equivalent resistance has little effect on any externally connected terminal resistor $r_{t2}$ at the other end of the bus. Hence, through enabling or disabling the pull-up enable line, manufacturers are free to choose whether to save output power to the terminal resistor $r_{t2}$ at the other end of the bus or not.

19 Claims, 3 Drawing Sheets

US 6,563,338 B2

CONTROL CIRCUIT AND CHIPSET ON MOTHERBOARD FOR SAVING TERMINAL RESISTORS AND METHOD FOR REALIZING THE SAME

CROSS-REFERENCE TO RELATED APPLICATION

This application claims the priority benefit of Taiwan application serial no. 89117012, filed Aug. 24, 2000.

BACKGROUND OF THE INVENTION

1. Field of Invention

The present invention relates to an input/output buffer. More particularly, the present invention relates to a high-frequency low-voltage-variation transmission bus having an active pull-up device capable of saving the terminal resistors of a motherboard having a central processing unit socket.

2. Description of Related Art

To increase packing density of semiconductor devices and reduce power consumption, the best strategy is to lower the operating voltage of an integrated circuit. Furthermore, because of a constant increase in the operating frequency of a computer system, the transmission bus of most computer systems can operate at a very high frequency with very little voltage variation. For example, the gunning transmission logic (GTL+) bus is a typical high-frequency low-voltage-variation transmission bus.

FIG. 1 is a circuit diagram showing the basic connections of a conventional GTL+ bus that uses a GTL+ input/output buffer. As shown in FIG. 1, the GTL+ bus comprises a first GTL+ input/output buffer (IC1), a second CTL+ input/output buffer (IC2), a first transmission line 100, a second transmission line 102 and a terminal resistor $r_{t2}$ (50Ω). One end of the terminal resistor $r_{t2}$ is connected to a terminal voltage $V_{tt}$ (1.5V) while the other end is connected to one end of the second transmission line 102. The other end of the second transmission line 102 is connected to one terminal of the first transmission line 100 and IC1. The other end of the first transmission line 100 is connected to IC2.

When IC2 serves as a transmitting terminal and IC1 serves as a receiving terminal, the terminal IC1 receives very little ring back interference because IC1 is relatively close to the terminal resistor $r_{t2}$. On the contrary, if IC1 is used as a transmitting terminal while IC2 is used as a receiving terminal, waveform received may be distorted due to a ring back effect resulting from a lack of terminal resistor nearby. Ring back effect can be reduced by adding a 50Ω resistor connected a voltage $V_{tt}$ inside IC2 or adding a 50Ω resistor to a printed circuit board outside IC2 (a resistor $r_{t1}$ on the transmission line 104).

However, due to the presence of two terminal resistors $r_{t1}$ and $r_{t2}$, power consumption increases considerably. In addition, forming another 50 resistors on a printed circuit board outside each IC2 increases the area requirement of the printed circuit board as well as production cost.

FIG. 2 is a circuit diagram showing the connections from a Pentium II central processing unit (CPU) to a conventional Pentium II motherboard through a dedicated slot. Because the Pentium II CPU uses a single edge contact cartridge (SECC) having a printed circuit board (PCB) 203 therein, the Pentium II CPU, cache memory and terminal resistor $r_{t2}$ are integrated together on the PCB 203. Since the PCB 203 has considerable space, putting the terminal resistor $r_{t2}$ on the PCB 203 results in no routing problem for the Pentium II motherboard. The input/output buffer 2011 inside the Pentium II chipset 201 has a built-in terminal resistor $r_{t1}$ connected to a terminal voltage $V_{tt}$. A signal sent from the input/output buffer 2011 is forwarded to the printed circuit board 203 after passing through the transmission line 202. Similarly, the input/output buffer 2032 inside the PCB 203 of the SECC is connected via a transmission line 2031 to another resistor $r_{t2}$ and then to a terminal voltage $V_{tt}$. With such transmission routing, each end has a terminal resistor capable of reducing ring back effect.

FIG. 3 is a schematic diagram showing a PCB routing layout on a motherboard close to the CPU socket. As shown in FIG. 3, a pin grid array (PGA) central processing unit (not shown) is connected to a chipset 301 by plugging into a CPU socket 302. Unlike the SECC PCB of a Pentium II CPU, a PGA CPU does not have a SECC PCB. Hence, the PGA CPU must attach a terminal resistor $r_{t2}$ on the motherboard 300 close to the CPU socket 302. Because a PGA socket usually has a large number of pins, there is limited space between the socket pins. Hence, difficulties in routing on the motherboard 300 are often encountered when attempts are made to locate a terminal resistor $r_{t2}$ at a position close to the CPU socket 302. For example, after the chipset 301 connects a signal line to the CPU socket 302, the connecting line has to re-route out of the socket 302 on the motherboard 300 to connect with terminal resistors $r_{t2}$. Hence, wiring between two socket pins has to double, resulting in serious routing problems.

FIG. 4 is a circuit diagram showing the resistor regulator of a conventional input/output buffer. As shown in FIG. 4, the resistor regulator 400 includes an input/output buffer 409, PMOS transistors 401, 402, 403, NMOS transistors 405, 406, 407, an output transistor 404 and a resistor R1. Through external signals PEN, $\overline{ZI+OEN}$ and $\overline{(A*OEN)}$, the equivalent resistance between the source and drain terminal of the output transistor 404 and resistor R1 are serially connected to produce a variable resistance in the range of about 100–200Ω. Hence, ring back effect on the bus is minimized. Yet, power is still consumed by the terminal resistor at the other end of the bus. Furthermore, the drain terminals of the PMOS transistors 401, 402 403 inside the conventional resistor regulator 400 are connected to a terminal voltage $V_{tt}$. Consequently, the number of terminal voltage ($V_{tt}$) balls supplied by the chipset (in BGA package) is insufficient, leading to a large inductance on the $V_{tt}$ balls. When the output transistor 404 is switched 'ON', the terminal voltage $V_{tt}$ drops to about 0.9V. A terminal voltage of around 0.9V is very close to the threshold voltage $V_{th}$ of the output transistor 404. Therefore, the variable resistance resulting from the serial connection of the equivalent resistance between the source and the drain terminal of the output transistor 404 and the resistor R1 may change from about 100–200Ω to about a thousand Ω. Thus, not only the power consumption of the terminal resistor on the motherboard is not reduced, but the ring back effect is not improved either.

SUMMARY OF THE INVENTION

Accordingly, one object of the present invention is to provide a control circuit capable of saving terminal resistors on a motherboard and suitable for operating on a high-frequency low-voltage-variation transmission bus such as a GTL+ bus. The invention utilizes a field effect transistor to locate a terminal resistor between an input/output buffer and a first voltage source when a pull-up enable signal is asserted. Hence, there is no need to use a terminal resistor at either end of the bus when external resistor $r_{t2}$ is eliminated.

A second object of the invention is to provide a chipset capable of saving terminal resistors on a motherboard and suitable for operating on a high-frequency low-voltage-variation transmission bus such as a GTL+ bus. The chipset is capable of providing an output resistance of about 45–60Ω to replace an external terminal resistor $r_{t2}$. Therefore, motherboard routing is simplified and the area requirement of the motherboard is reduced.

A third object of the invention is provide a method capable of saving terminal resistors on a motherboard and suitable for operating on a high-frequency low-voltage-variation transmission bus such as a GTL+ bus. By activating a pull-up enable signal, a control circuit outputs a resistance of about 45–60Ω to replace an external terminal resistor $r_{t2}$. Therefore, motherboard routing is simplified and the area requirement of the motherboard is reduced.

To achieve these and other advantages and in accordance with the purpose of the invention, as embodied and broadly described herein, the invention provides a control circuit to be used inside an input/output buffer capable of saving terminal resistors on a motherboard. The input/output buffer is suitable for operating on a high-frequency low-voltage-variation transmission bus. The input/output buffer has an input/output pad. The control circuit includes a first field effect transistor, a second field effect transistor and a third field effect transistor. The gate terminal of the first field effect transistor is connected to a pull-up enable signal line and a first source/drain terminal of the first field effect transistor is connected to a first voltage source. The gate terminal of the second field effect transistor is connected to the pull-up enable signal line. A first source/drain terminal of the second field effect transistor is connected to a second source/drain terminal of the first field effect transistor. A second source/drain terminal of the second field effect transistor is connected to a ground. The gate terminal of the third field effect transistor is connected to the second source/drain terminal of the first field effect transistor. A first source/drain terminal of the third field effect transistor is connected to a second voltage source. A second source/drain terminal of the third field effect transistor is connected to the input/output pad. When the pull-up enable signal is activated, the second field effect transistor is cut off while the first field transistor is turned on. Hence, an equivalent resistance is set up between the source and the drain terminal of the third field effect transistor in parallel between the input/output pad and the second voltage source. An equivalent resistance of about 45–60Ω is set to replace another terminal resistor $r_{t2}$ at the other end of the external bus. Ultimately, motherboard routing is simplified. When the pull-up enable signal is disabled, the second field effect transistor is turned on while the first and the third field effect transistors are cut off. Consequently, an infinite resistance is set up between the source and the drain terminal of the third field effect transistor in parallel between the input/output pad and the second voltage source. Hence, the motherboard can now use the terminal resistor $r_{t2}$ at the other end of the bus.

This invention also provides a chipset capable of saving terminal resistors on a motherboard and suitable for operating on a high-frequency low-voltage-variation transmission bus. The chipset includes an input/output pad for receiving a signal and a control circuit for outputting a terminal resistor. The control circuit comprises a first field effect transistor, a second field effect transistor and a third field effect transistor. The gate terminal of the first field effect transistor is connected to a pull-up enable signal line and a first source/drain terminal of the first field effect transistor is connected to a first voltage source. The gate terminal of the second field effect transistor is connected to the pull-up enable signal line. A first source/drain terminal of the second field effect transistor is connected to a second source/drain terminal of the first field effect transistor. A second source/drain terminal of the second field effect transistor is connected to a ground. The gate terminal of the third field effect transistor is connected to the second source/drain terminal of the first field effect transistor. A first source/drain terminal of the third field effect transistor is connected to a second voltage source. A second source/drain terminal of the third field effect transistor is connected to the input/output pad. When the pull-up enable signal is activated, the second field effect transistor is cut off while the first field transistor is turned on. Hence, an equivalent resistance is set up between the source and the drain terminal of the third field effect transistor in parallel between the input/output pad and the second voltage source. The equivalent resistance thus set up replaces another terminal resistor $r_{t2}$ at the other end of the external bus. Ultimately, motherboard routing is simplified and area requirement of the motherboard is reduced. When the pull-up enable signal is at a low potential, the second field effect transistor is turned on while the first and the third field effect transistor are cut off. Consequently, an infinite equivalent resistance is set up between the source and the drain terminal of the third field effect transistor in parallel between the input/output pad and the second voltage source. The infinite equivalent resistance between the input/output pad and the second voltage source has no effect on the terminal resistor $r_{t2}$ at the other end of the bus. Hence, the motherboard can now use the terminal resistor $r_{t2}$ at the other end of the external bus.

This invention also provides a method capable of saving terminal resistors on a motherboard and suitable for operating on a high-frequency low-voltage-variation transmission bus. The method includes providing a pull-up enable signal, a first field effect transistor, a second field effect transistor and a third field effect transistor. The gate terminal of the first field effect transistor is connected to the pull-up enable signal line. A first source/drain terminal of the first field effect transistor is connected to a first voltage source. The gate terminal of the second field effect transistor is connected to the pull-up enable signal line. A first source/drain terminal of the second field effect transistor is connected to a second source/drain terminal of the first field effect transistor. A second source/drain terminal of the second field effect transistor is connected to a ground. The gate terminal of the third field effect transistor is connected to the second source drain terminal of the first field effect transistor. A first source/drain terminal of the third field effect transistor is connected to a second voltage source. A second source/drain terminal of the third field effect transistor is connected to the input/output pad.

When the pull-up enable signal is activated, the second field effect transistor is cut off while the first field transistor is turned on. Hence, an equivalent resistance of about 45–60Ω is set up between the source and the drain terminal of the third field effect transistor in parallel between the input/output pad and the second voltage source. Thus, the terminal resistor $r_{t2}$ at the other end of the bus on the motherboard can be cut out. When the pull-up enable signal is disabled, the second field effect transistor is turned on while the first field effect transistor and the third field effect transistor are cut off. Consequently, an infinite resistance is set up between the source and the drain terminal of the third field effect transistor in parallel between the input/output pad and the second voltage source. Hence, the motherboard can now use the terminal resistor $r_{t2}$ at the other end of the bus.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
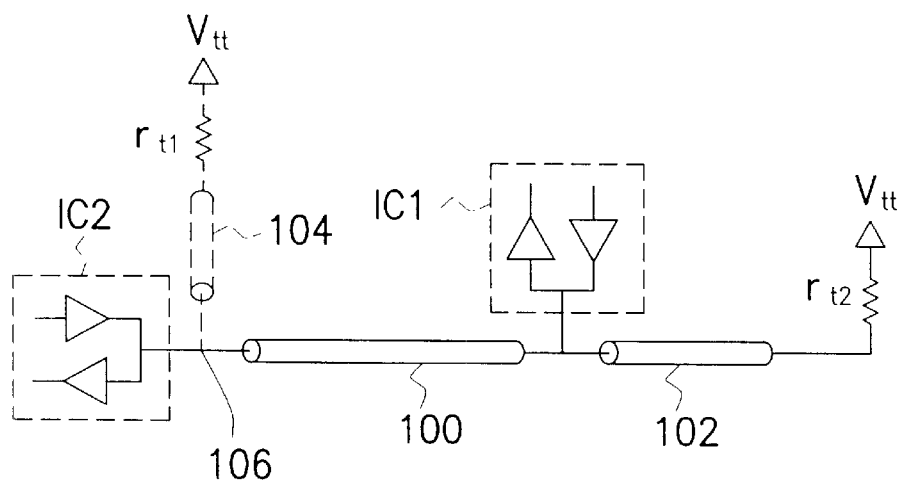
FIG. 1 is a circuit diagram showing the basic connections of a conventional GTL+ input/output bus that uses a GTL+ input/output buffer.
Figure 2:
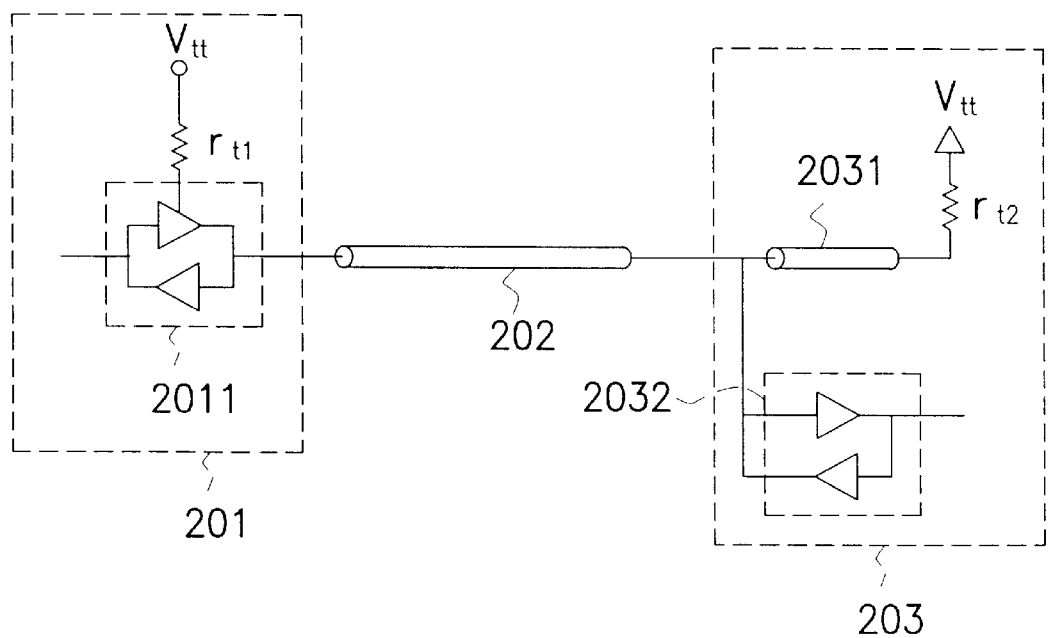
FIG. 2 is a circuit diagram showing the connections from a Pentium II central processing unit to a conventional Pentium II motherboard through a dedicated slot.
Figure 3:
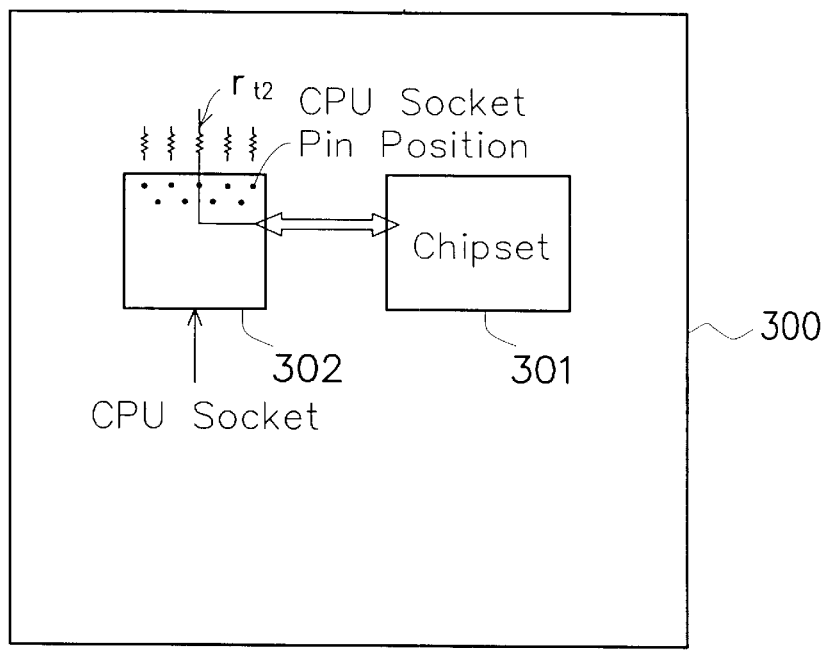
FIG. 3 is a schematic diagram showing a PCB routing layout on a motherboard close to the CPU socket.
Figure 4:
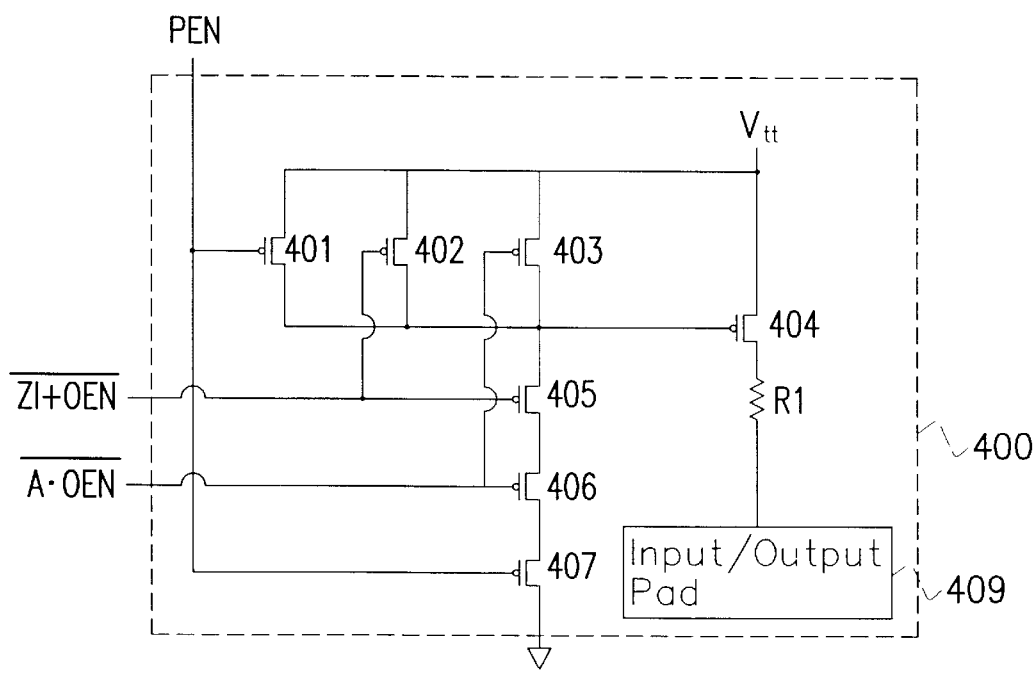
FIG. 4 is a circuit diagram showing the resistor regulator of a conventional input/output buffer.

Reference will now be made in detail to the present preferred embodiments of the invention, examples of which are illustrated in the accompanying drawings. Wherever possible, the same reference numbers are used in the drawings and the description to refer to the same or like parts.

Figure 5:
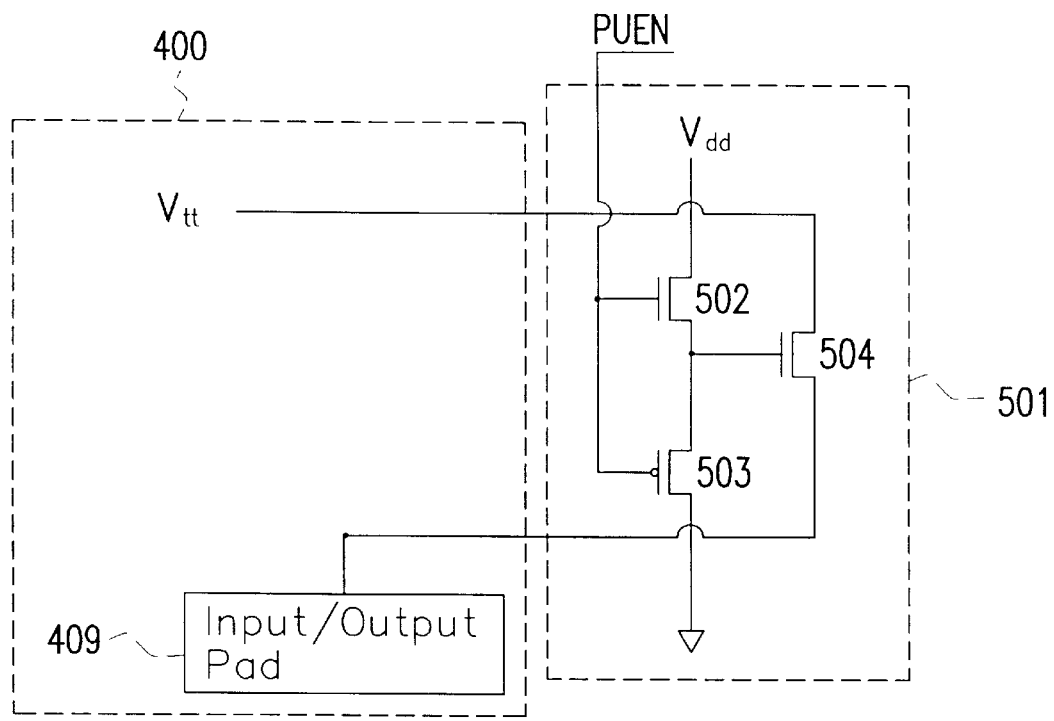
FIG. 5 is a schematic diagram showing the control circuit on a motherboard capable of saving terminal resistors according to this invention.

FIG. 5 is a schematic diagram showing the control circuit on a motherboard capable of saving terminal resistors according to this invention. As shown in FIG. 5, the control circuit 501 includes a first field effect transistor 502, a second field effect transistor 503 and a third field effect transistor 504. The gate terminal of the first field effect transistor 502 is connected to a pull-up enable (PUEN) signal line. A first source/drain terminal of the first field effect transistor 502 is connected to a first voltage source $V_{dd}$. The gate terminal of the second field effect transistor 503 is also connected to the pull-up enable (PUEN) signal line. A first source/drain terminal of the second field effect transistor 503 is connected to a second source/drain terminal of the first field effect transistor 502. A second source/drain terminal of the second field effect transistor 503 is connected to a ground. The gate terminal of the third field effect transistor 504 is connected to the second source/drain terminal of the first field effect transistor 502. A first source/drain terminal of the third field effect transistor 504 is connected to a second voltage source $V_{tt}$. A second source/drain terminal of the third field effect transistor 504 is connected to an input/output pad 409.

The pull-up enable signal line is connected via a resistor to the first voltage source $V_{dd}$. After switching a computer system on, whether the third field effect transistor 504 is turned on depends on the connection of the pull-up enable signal line to the first voltage source via the resistor. When the third field effect transistor 504 is turned on, an equivalent resistance of about 45–60Ω is created and connected in parallel between the input/output pad 409 and the second voltage source $V_{tt}$. For example, when the pull-up enable is connected to the first voltage source $V_{dd}$ via a resistor, the pull-up enable line is activated (for example, to a high potential level). The first field effect transistor 502 is turned on while the second field effect transistor 503 is cut off. Output voltage from the first field effect transistor 502 causes the third field effect transistor 504 to conduct and hence created an equivalent resistance of about 45–60Ω between the input/output pad 409 and the second voltage source $V_{tt}$. The equivalent resistance is capable of replacing the original necessarily externally connected terminal resistor $r_{t2}$ at the other end of the bus on the motherboard. Ultimately, routing on the motherboard is simplified and area requirement of the motherboard is reduced. When the pull-up enable line is not connected to a first voltage source $V_{dd}$ via a resistor, the pull-up enable line is disabled (for example, at a low potential level). In this case, the first field effect transistor 502 is cut off while the second field effect transistor 503 is turned on. The second field effect transistor 503 outputs a low potential and hence the third field effect transistor 504 is cut off. An infinite equivalent resistance is created between the source and the drain terminal of the third field effect transistor 504. The infinite equivalent resistance has little effect on any externally connected terminal resistor $r_{t2}$ at the other end of the bus. Hence, through enabling or disabling the pull-up enable line, manufacturers are free to choose whether to save the terminal resistor $r_{t2}$ at the other end of the bus or not.

In addition, when the pull-up enable line is activated, the second field effect transistor 503 is cut off, leading to conduction of the first field effect transistor 502. Hence, an equivalent resistance of about 45–60Ω is created between the source and the drain terminal of the third field effect transistor 504 connected in parallel between the input/output pad 409 and the second voltage source $V_{tt}$. When the third field effect transistor 504 is conductive, $V_{gs}$=voltage of the first voltage source–voltage of the second voltage source. For example, when the first voltage source=3.3V and the second voltage source=1.5V, $V_{gs}$=3.3V−1.5V=1.8V. $V_{gs}$ at 1.8V is thus much greater than the threshold voltage $V_{th}$ of the field effect transistor. This is a big improvement over the conventional structure with a low Vgs, which often causes inductance problems. Furthermore, the equivalent resistance between the source and the drain terminal of the third field effect transistor 504 can be stabilized at around 45 to 60Ω. The value of the first voltage source $V_{dd}$ can be set to 3.3V, 2.5V or 2.0V, for example. The value of the second voltage source $V_{tt}$ can be set to 1.5V, for example. However, anyone familiar with the techniques may notice that other variations of the design are possible as long as the spirit of this invention is not violated.

This invention also provides a method capable of saving terminal resistors on a motherboard and suitable for operating on a high-frequency low-voltage-variation transmission bus. The method includes providing a pull-up enable signal line, a first field effect transistor 502, a second field effect transistor 503 and a third field effect transistor 504. The gate terminal of the first field effect transistor 502 is connected to the pull-up enable signal line. A first source/drain terminal of the first field effect transistor 502 is connected to a first voltage source. The gate terminal of the second field effect transistor 503 is connected to the pull-up enable signal line. A first source/drain terminal of the second field effect transistor 503 is connected to a second source/drain terminal of the first field effect transistor 502. A second source/drain terminal of the second field effect transistor 503 is connected to a ground. The gate terminal of the third field effect transistor 504 is connected to the second source drain terminal of the first field effect transistor 502. A first source/drain terminal of the third field effect transistor 504 is connected to a second voltage source. A second source/drain terminal of the third field effect transistor 504 is connected to the input/output pad 409.

When the pull-up enable signal is activated, the second field effect transistor 503 is cut off while the first field transistor 502 and the third field effect transistor 504 are turned on. Hence, an equivalent resistance is set up between the source and the drain terminal of the third field effect transistor 504 in parallel between the input/output pad 409 and the second voltage source. Thus, the terminal resistor $r_{t2}$ at the other end of the bus on the motherboard can be cut out.

The second voltage source $V_{tt}$ can be set to 1.5V and the first voltage source $V_{dd}$ can be set to 3.3, 2.5 or 2.0V, for example. However, anyone familiar with the techniques may notice that other variations of the design are possible as long as the spirit of this invention is not violated. In general, the equivalent resistance between the source and the drain terminal of the third field effect transistor 504 is about 45–60Ω, but other values are also acceptable as needed.

The pull-up enable signal line is connected via a resistor to a first voltage source $V_{dd}$. After switching a computer system on, whether the third field effect transistor 504 is turned on depends on the connection of the pull-up enable signal line to the first voltage source $V_{dd}$ via the resistor. When the third field effect transistor 504 is turned on, an equivalent resistance of about 45–60Ω is set between the source and the drain terminal of the third field effect transistor 504. For example, when the pull-up enable line is connected to the first voltage source $V_{dd}$ via a resistor, the pull-up enable line is activated. The first field effect transistor 502 is turned on while the second field effect transistor 503 is cut off. The output voltage of the first field effect transistor 502 causes the third field effect transistor 504 to conduct and hence created an equivalent resistance of about 45–60Ω in parallel between the input/output pad 409 and the second voltage source $V_{tt}$. The equivalent resistance is capable of replacing the original necessarily externally connected terminal resistor $r_{t2}$ at the other end of the bus on the motherboard. Ultimately, routing on the motherboard is simplified and area requirement of the motherboard is reduced. When the pull-up enable line is not connected to a first voltage source $V_{dd}$ via a resistor, the pull-up enable line is disabled (for example, at a low potential level). In this case, the first field effect transistor 502 is cut off while the second field effect transistor 503 is turned on. The second field effect transistor 503 output a low potential and hence the third field effect transistor 504 is cut off. An infinite equivalent resistance is created between the source and the drain terminal of the third field effect transistor 504 and connected in parallel between the input/output pad 409 and the second voltage source $V_{tt}$. The infinite equivalent resistance has little effect on any externally connected terminal resistor $r_{t2}$ at the other end of the bus. Hence, through enabling or disabling the pull-up enable line, manufacturers are free to choose whether to save the terminal resistor $r_{t2}$ at the other end of the bus or not.

Figure 6:
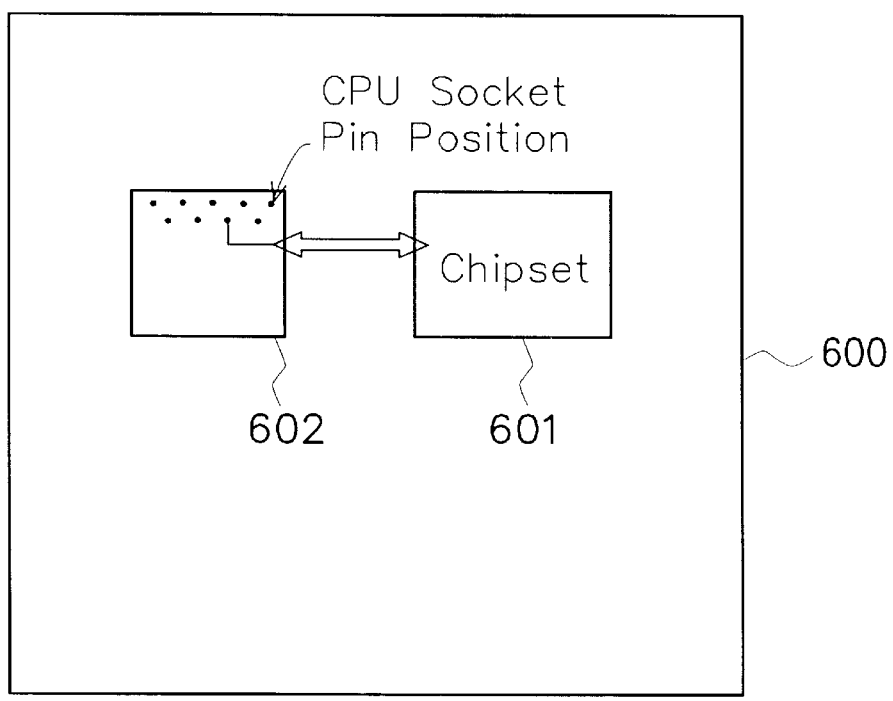
FIG. 6 is a block diagram showing the connection between a chipset and a central processing unit socket on a motherboard capable of saving terminal resistors according to this invention.

FIG. 6 is a block diagram showing the connection between a chipset and a central processing unit socket on a motherboard capable of saving terminal resistors according to this invention. The chipset of this invention is used on a motherboard 600. The motherboard 600 includes a chipset 601 and a central processor socket 602. The chipset 601 contains the control circuit 501 shown in FIG. 5. By activating the pull-up enable line of the control circuit 501 inside the chipset 601, the control circuit outputs an equivalent resistance of about 45–60Ω. Hence, after the signal line of the chipset has linked to the central processor socket 602, there is no need to re-route around to connect with the terminal resistor $r_{t2}$ at the other end of the bus. Ultimately, wiring between the socket 602 pins is only half of the conventional routing design. Therefore, routing on the motherboard is very much simplified and area requirement of motherboard is greatly reduced.

In summary, this invention provides a control circuit, a chipset and a method capable of saving terminal resistors on a motherboard. When a pull-up enable line is connected to a first voltage source $V_{dd}$ via a resistor, an equivalent resistance of about 45–60Ω is set between the source terminal and the drain terminal of the third field effect transistor 504. For example, when the pull-up enable line is connected to the first voltage source $V_{dd}$ via a resistor, an equivalent resistance of about 45–60Ω is established between the source and drain terminal of the third field effect transistor 504. The equivalent resistance is connected in parallel with the input/output pad 409 and the second voltage source $V_{tt}$ to replace the original externally connected terminal resistor $r_{t2}$ at the other end of the bus. Hence, routing on the motherboard is simplified and area requirement of the motherboard is reduced. On the other hand, if the pull-up enable line is not connected to a first voltage source $V_{dd}$ via a resistor, the pull-up enable line is disabled. In this case, an infinite equivalent resistance is created between the source and the drain terminal of the third field effect transistor 504 and connected in parallel between the input/output pad 409 and the second voltage source $V_{tt}$. The infinite equivalent resistance has little effect on any externally connected terminal resistor $r_{t2}$ at the other end of the bus. Hence, through enabling or disabling the pull-up enable line, manufacturers are free to choose whether to save the terminal resistor $r_{t2}$ at the other end of the bus or not.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A control circuit to be used inside an input/output buffer for replacing a terminal resistor on a motherboard, wherein the input/output buffer has an input/output pad, comprising:

a first field effect transistor, wherein a gate terminal of the first field effect transistor is connected to a pull-up enable signal line and a first source/drain terminal of the first field effect transistor is connected to a first voltage source;

a second field effect transistor, wherein a gate terminal of the second field effect transistor is connected to the pull-up enable signal line, a first source/drain terminal of the second field effect transistor is connected to a second source/drain terminal of the first field effect transistor, and a second source/drain terminal of the second field effect transistor is connected to a ground; and a third field effect transistor, wherein a gate terminal of the third field effect transistor is connected to the second source/drain terminal of the first field effect transistor, a first source/drain terminal of the third field effect transistor is connected to a second voltage source, and a second source/drain terminal of the third field effect transistor is connected to the input/output pad;

wherein when the pull-up enable signal line is activated, the second field effect transistor is cut off while the first field effect transistor is turned on so that an equivalent resistance is set up between the source and the drain terminal of the third field effect transistor and connected in parallel between the input/output pad and the second voltage source.

2. The control circuit of claim 1, wherein the first voltage source has a voltage of about 3.3V.

3. The control circuit of claim 1, wherein the first voltage source has a voltage of about 2.5V.

4. The control circuit of claim 1, wherein the first voltage source has a voltage of about 2.0V.

5. The control circuit of claim 1, wherein the second voltage source has a voltage of about 1.5V.

6. The control circuit of claim 1, wherein the equivalent resistance has a value of about 45–60Ω.

7. The control circuit of claim 1, wherein the pull-up enable signal line is connected to the first voltage source via a resistor so that the third field effect transistor can be turned on and the equivalent resistance can be output from the control circuit.

8. A chipset for replacing a terminal resistor on a motherboard having a central processor socket, comprising:
an input/output pad for receiving an input/output signal;
a first voltage source;
a second voltage source; and
a control circuit for outputting an equivalent resistance between the input/output pad and the second voltage source further comprising:
a first field effect transistor wherein a gate terminal of the first field effect transistor is connected to a pull-up enable signal line and a first source/drain terminal of the first field effect transistor is connected to a first voltage source;
a second field effect transistor, wherein a gate terminal of the second field effect transistor is connected to the pull-up enable signal line, a first source/drain terminal of the second field effect transistor is connected to a second source/drain terminal of the first field effect transistor, and a second source/drain terminal of the second field effect transistor is connected to a ground; and
a third field effect transistor, wherein a gate terminal of the third field effect transistor is connected to the second source/drain terminal of the first field effect transistor, a first source/drain terminal of the third field effect transistor is connected to a second voltage source, and a second source/drain terminal of the third field effect transistor is connected to the input/output pad;
wherein when the pull-up enable signal line is activated, the second field effect transistor and the third field effect transistor are cut off while the first field effect transistor is turned on so that an equivalent resistance is set up between the source and the drain terminal of the third field effect transistor and connected in parallel between the input/output pad and the second voltage source.

9. The chipset of claim 8, wherein the pull-up enable signal line is connected to the first voltage source via a resistor so that the third field effect transistor can be turned on and the equivalent resistance can be output from the control circuit.

10. The chipset of claim 8, wherein the equivalent resistance has a value of about 45–60Ω.

11. The chipset of claim 8, wherein the first voltage source has a voltage of about 3.3V.

12. The chipset of claim 8, wherein the first voltage source has a voltage of about 2.5V.

13. The chipset of claim 8, wherein the first voltage source has a voltage of about 2.0V.

14. The chipset of claim 8, wherein the second voltage source has a voltage of about 1.5V.

15. A method for replacing a terminal resistor on a motherboard suitable for a high-frequency low-voltage-variation transmission bus, comprising:
providing a pull-up enable signal; and
providing a first field effect transistor, a second field effect transistor and a third field effect transistor, wherein a gate terminal of the first field effect transistor is connected to the pull-up enable signal line, a first source/drain terminal of the first field effect transistor is connected to a first voltage source, a gate terminal of the second field effect transistor is also connected to the pull-up enable signal line, a first source/drain terminal of the second field effect transistor is connected to a second source/drain terminal of the first field effect transistor, a second source/drain terminal of the second field effect transistor is connected to a ground, a gate of the third field effect transistor is connected to the second source/drain terminal of the first field effect transistor, a first source/drain terminal of the third field effect transistor is connected to a second voltage source, and a second source/drain terminal of the third field effect transistor is connected to an input/output pad;
wherein when the pull-up enable signal line is activated, the second field effect transistor is cut off while the first and the third field effect transistor are turned on so that an equivalent resistance is set up between the source and the drain terminal of the third field effect transistor in parallel between the input/output pad and the first voltage source.

16. The method of claim 15, wherein the first voltage source has a voltage of about 3.3V.

17. The method of claim 15, wherein the second voltage source has a voltage of about 1.5V.

18. The method of claim 15, wherein the equivalent resistance has a value of about 45–60Ω.

19. The method of claim 15, wherein the pull-up enable signal line is connected to the first voltage source via a resistor so that the third field effect transistor can be turned on and the equivalent resistance can be output from the control circuit.

* * * * *